United States Patent
Park

(10) Patent No.: US 11,510,031 B2
(45) Date of Patent: *Nov. 22, 2022

(54) SMART WATCH HAVING DIGITAL RADIO FUNCTION

(71) Applicant: Sang Rae Park, Seoul (KR)

(72) Inventor: Sang Rae Park, Seoul (KR)

( * ) Notice: Subject to any disclaimer, the term of this patent is extended or adjusted under 35 U.S.C. 154(b) by 314 days.

This patent is subject to a terminal disclaimer.

(21) Appl. No.: 16/756,980

(22) PCT Filed: Jan. 23, 2018

(86) PCT No.: PCT/KR2018/000966
§ 371 (c)(1),
(2) Date: Apr. 17, 2020

(87) PCT Pub. No.: WO2019/083100
PCT Pub. Date: May 2, 2019

(65) Prior Publication Data
US 2021/0044941 A1  Feb. 11, 2021

(30) Foreign Application Priority Data

Oct. 26, 2017  (KR) ........................ 10-2017-0140273

(51) Int. Cl.
*H04W 4/10* (2009.01)
*A44C 5/14* (2006.01)
*H03M 1/12* (2006.01)

(52) U.S. Cl.
CPC .................. *H04W 4/10* (2013.01); *A44C 5/14* (2013.01); *H03M 1/12* (2013.01)

(58) Field of Classification Search
CPC ........ H04M 1/6066; H04M 9/08; H04M 1/60; H04B 17/318; H04W 4/10
See application file for complete search history.

(56) References Cited

U.S. PATENT DOCUMENTS

| 7,792,541 B1 | 9/2010 | El-Fishawy |
| 11,128,746 B2 * | 9/2021 | Park ........................ H04M 9/08 |

(Continued)

FOREIGN PATENT DOCUMENTS

| KR | 10-1016038 B1 | 2/2011 |
| KR | 10-1033170 B1 | 5/2011 |

(Continued)

OTHER PUBLICATIONS

International Search Report dated Jul. 24, 2018 in counterpart International Search Patent Application No. PCT/KR2018/000966 (2 pages in English and 2 pages in Korean).

*Primary Examiner* — Jae Y Lee
(74) *Attorney, Agent, or Firm* — NSIP Law

(57) ABSTRACT

A smart watch according to the present invention comprises: a reception unit to which an analog speech signal is inputted; a first amplification unit for amplifying the analog speech signal; an A/D converter for converting the amplified analog speech signal into a digital speech signal; a control unit for receiving and outputting the digital speech signal outputted from the A/D converter and outputting a digital speech signal received and inputted through an antenna; an RF transceiver for controlling signals such that the signal received through the antenna is inputted to the control unit, and the signal outputted from the control unit is transmitted through the antenna; a D/A converter for converting the digital speech signal into an analog speech signal; a second amplification unit for amplifying the analog speech signal; and a speech output unit for outputting the analog speech signal outputted from the second amplification unit.

19 Claims, 16 Drawing Sheets

(56) References Cited

U.S. PATENT DOCUMENTS

2014/0188348 A1\* 7/2014 Gautama ............ G07C 9/00309
   701/48
2016/0373586 A1\* 12/2016 Lim ........................ H04W 4/20
2018/0310159 A1\* 10/2018 Katz .................... H04M 3/5116

FOREIGN PATENT DOCUMENTS

| KR | 10-1475006 B1 | 12/2014 | |
|----|---------------|---------|---|
| KR | 10-1550648    | \* 9/2015 | ........... H04B 1/3827 |
| KR | 10-1550648 B1 | 9/2015  | |

\* cited by examiner

FIG. 2

| PREAMBLE | STARTER CODE | TRANSMISSION ID | RECEPTION ID | PAIRING CODE | CONTROL INST | VOICE DATA | COMPLETION CODE |

FIG. 3

| PACKET DELAY | SLOT NUMBER | SLOT RANKING | MASTER | SLAVE | REMOTE TRANSMISSION | RESERVE 1 | RESERVE 2 |

FIG. 13

| DTMF | 1209 Hz | 1336 Hz | 1477 Hz | 1633 Hz |
|---|---|---|---|---|
| 697 Hz | 1 | 2 | 3 | A |
| 770 Hz | 4 | 5 | 6 | B |
| 852 Hz | 7 | 8 | 9 | C |
| 941 Hz | E ( * ) | 0 | F ( # ) | D |

SMART WATCH HAVING DIGITAL RADIO FUNCTION

CROSS REFERENCE TO RELATED APPLICATIONS

This application is the U.S. National Stage Application of International Application No. PCT/KR2018/000966, filed on Jan. 23, 2018, which claims the benefit under 35 U.S.C. § 119(a) and § 365(b) of Korean Patent Application No. 10-2017-0140273, filed on Oct. 26, 2017, in the Korean Intellectual Property Office, the entire disclosure of which is incorporated herein by reference for all purposes.

TECHNICAL FIELD

The present invention relates to a smart watch, for example, to a smart watch having a digital radio function which allows transmission and reception to be performed at the same time using a time sharing method through a full duplex communication function.

BACKGROUND ART

A radio is a device used for wireless telegraph or a radiotelephony. When a radio is used, a base station or a relay station for mutual connection is not necessary and mutual communication is performed without a phone bill being charged. Due to these advantages, radios are used in a variety of fields. As examples thereof, a portable radio, a daily radio, a vehicular radio, and a trunked radio system (TRS) radio are used in an industrial filed, a plant, hiking and leisure sports fields in addition to policemen.

A radio is configured to convert and output a signal received through an antenna through an external speaker to reproduce a received voice and to transmit a transmitted voice input through an external microphone.

However, a simplex or half duplex method is used in currently-provided radios, and particularly, in wearable radios which have been developed recently.

Also, since a voice may be generally input by operating a push to talk (PTT) button in general radios which are currently provided and wearable radios which have been developed recently, a voice input process thereof is relatively inconvenient. Also, in the case of a wearable radio in which security is needed according to use, there is a disadvantage that a voice input operation is distinctly seen.

Also, since general radios, which are currently provided, and wearable radios, which have been developed recently, consume a large amount of power during a standby status, it is necessary to frequently replace a battery and a failure caused by battery depletion frequently occurs.

DISCLOSURE

Technical Problem

The present invention is directed to providing a smart watch having a digital radio function which performs transmission and reception at the same time using a time sharing method with a full duplex communication function.

The present invention is also directed to providing a smart watch having a digital radio function in which since communication is available among devices having the digital radio function in a communication group set through a division function using a code combination, the communication among the devices having the digital radio function in the corresponding communication group is performed in a clear state in which noise and crosstalk are prevented as much as possible.

The present invention is also directed to providing a smart watch having a digital radio function which allows a user to automatically transmit a voice signal input to a reception portion through a radio frequency (RF) transceiver and an antenna without additionally manipulating a push to talk (PTT) button and the like for inputting a voice.

The present invention is also directed to providing a smart watch having a digital radio function to remotely control transmission of another device having the digital radio function and which allows a master-slave relationship to be formed between a plurality of devices having the digital radio function, allows voice conversations to be more efficiently performed among the devices having the digital radio function in which the master-slave relationship is formed.

The present invention is also directed to providing a smart watch having a digital radio function to set a communication group with other devices having the digital radio function within a limited range by, for example, converting and transmitting communication group setting information into a dual-tone multi-frequency (DTMF) signal or transmitting communication group setting information including a certain received signal strength indicator (RSSI) reference value.

Technical Solution

One aspect of the present invention provides a smart watch having a digital radio function. The smart watch includes a reception portion to which an analog voice signal is input, a first amplification portion amplifying the analog voice signal input through the reception portion, an analog/digital (A/D) converter converting the amplified analog voice signal output by the first amplification portion into a digital voice signal, a control portion receiving and outputting the digital voice signal output from the A/D converter and outputting a digital voice signal received and input through an antenna, a radio frequency (RF) transceiver controlling input of the signal received through the antenna to the control portion and transmission of the signal output from the control portion through the antenna, a digital/analog (D/A) converter converting the digital voice signal output from the control portion into an analog voice signal, a second amplification portion amplifying the analog voice signal output from the D/A converter, and a voice output portion externally transmitting the analog voice signal output from the second amplification portion. Here, the control portion enables full duplex communication with another wireless communication device by controlling a time sharing function of the antenna.

The control portion may set a group of other devices having the digital radio function, which are capable of performing communication through a sharing function using a code combination, and enable communication only among devices having the digital radio function in the set group.

The smart watch may further include a comparator connected to an output end of the first amplification portion with the A/D converter in parallel to determine whether voice data is present in the amplified analog voice signal output from the first amplification portion. Here, the control portion may be connected to the A/D converter and the comparator in parallel and automatically output the digital voice signal input from the A/D converter to the RF transceiver according to a signal input from the comparator.

The smart watch may further include an input portion for inputting a signal including a push-to-talk (PTT) to the control portion.

A smart phone paired with the smart watch may be connected to the control portion and be capable of displaying and changing a system setting value and status information of the smart watch having the digital radio function on a screen.

The control portion may output a signal to the RF transceiver while dividing the signal into a basic packet and a control INST packet, the basic packet may be a transmission and reception digital basic frame including voice data, and the control INST packet may be a frame including a control instruction set necessary in addition to transmission of the voice data and additionally and separately transmitted to the basic packet whenever an instruction occurs.

The basic packet may include a preamble, a starter code, a transmission ID, a reception ID, a pairing code, a control INST, voice data, and a completion code, and the control INST packet may include a packet delay, a slot number, a slot ranking, a master, a slave, remote transmission, Reserve 1, and Reserve 2.

The master and the slave of the control INST packet may include information on a master that distributes a control instruction set and information on a slave that receives the control instruction set distributed by the master, and include information that the master transfers authority of distributing the control instruction set to a particular slave.

The remote transmission of the control INST packet may include information on transmission control and exclusive reception of a master with respect to a particular slave.

A slot number n and a slot ranking N may be indicated in the slot number and the slot ranking of the control INST packet such that when a number of communicators in the communication group exceeds the slot number n, a new communicator may be allowed to enter the slot number while replacing a communicator of a last ranking N to perform communication (here, a communicator with a slot number exceeding n in the group also may be allowed to always perform reception from all the communicators).

A maximum time slot Tn of the basic packet may equal a packet delay/a slot number T/n (here, the slot number n is an integer smaller than <a maximum transmission velocity/a general voice sampling velocity of 20 kbps> and is extensible through data compression as necessary).

In a standby status for receiving a signal from another device having the digital radio function through the antenna or a standby status for receiving an analog voice signal from the other device through the reception portion, the control portion may remain in a sleep mode for a preset time and then operate in an auto-polling mode for a preset time to repetitively perform conversion into the sleep mode and the auto-polling mode so as to reduce power consumption while standing by for reception.

The control portion may transmit communication group setting information to other devices having the digital radio function within a limited range so as to set a communication group with the other devices having the digital radio function.

The control portion may convert the communication group setting information into a dual-tone multi-frequency (DTMF) signal and transmit the DTMF signal through the voice output portion. Here, when the DTMF signal is input through the reception portion, the control portion may obtain communication group setting information by decoding the input DTMF signal.

The DTMF signal may have frequency components of a 4×4 matrix.

The control portion may transmit the communication group setting information including a certain received signal strength indicator (RSSI) reference value through the antenna. Here, when communication group setting information is received through the antenna, the control portion may extract an RSSI reference value from the received communication group setting information and check the received communication setting information when a measured RSSI value is greater than or equal to the extracted RSSI reference value.

The communication group setting information may include a control INST packet, and the RSSI reference value may be included in an area of Reserve 1 or Reserve 2 of the control INST packet.

The communication group setting information may include ID, a pairing code, a master, a slave, and a control INST of another device having the digital radio function to be included in the communication group.

The control portion may amplify a signal received through the antenna and transmit the amplified signal through the antenna so as to allow the smart watch having the digital radio function to perform a repeater or relay function.

Advantageous Effects

According to the embodiments of the present invention, a smart watch having a digital radio function may perform transmission and reception at the same time using a time sharing method with a full duplex communication function.

Also, since communication is available among devices having the digital radio function in a communication group set through a division function using a code combination, the communication among the devices having the digital radio function in the corresponding communication group may be performed in a clear state in which noise and crosstalk are prevented as much as possible.

Also, power consumption in a reception standby state may be greatly reduced through a function of the smart watch having the digital radio function in which one cycle including the sleep mode and the auto-polling mode is repetitively performed in the reception standby state.

Also, a user may automatically transmit a voice signal input to a reception portion through a radio frequency (RF) transceiver and an antenna without additionally manipulating a push-to-talk (PTT) button and the like for inputting a voice.

Also, since it is possible to remotely control transmission of another device having the digital radio function and to form a master-slave relationship between a plurality of devices having the digital radio function, voice conversations may be more efficiently performed among the devices having the digital radio function in which the master-slave relationship is formed. Also, a communication group with other devices having the digital radio function within a limited range may be set by, for example, converting and transmitting communication group setting information into a dual-tone multi-frequency (DTMF) signal or transmitting communication group setting information including a certain received signal strength indicator (RSSI) reference value.

DESCRIPTION OF DRAWINGS

FIGS. 2 and 3 are views illustrating a basic packet and a control INST packet of the smart watch having the digital radio function according to one embodiment of the present invention.

FIG. 13 is a view illustrating an example of a dual tone multi-frequency (DTMF) signal used in the communication group setting method of FIG. 12.

MODES OF THE INVENTION

Figure 1:
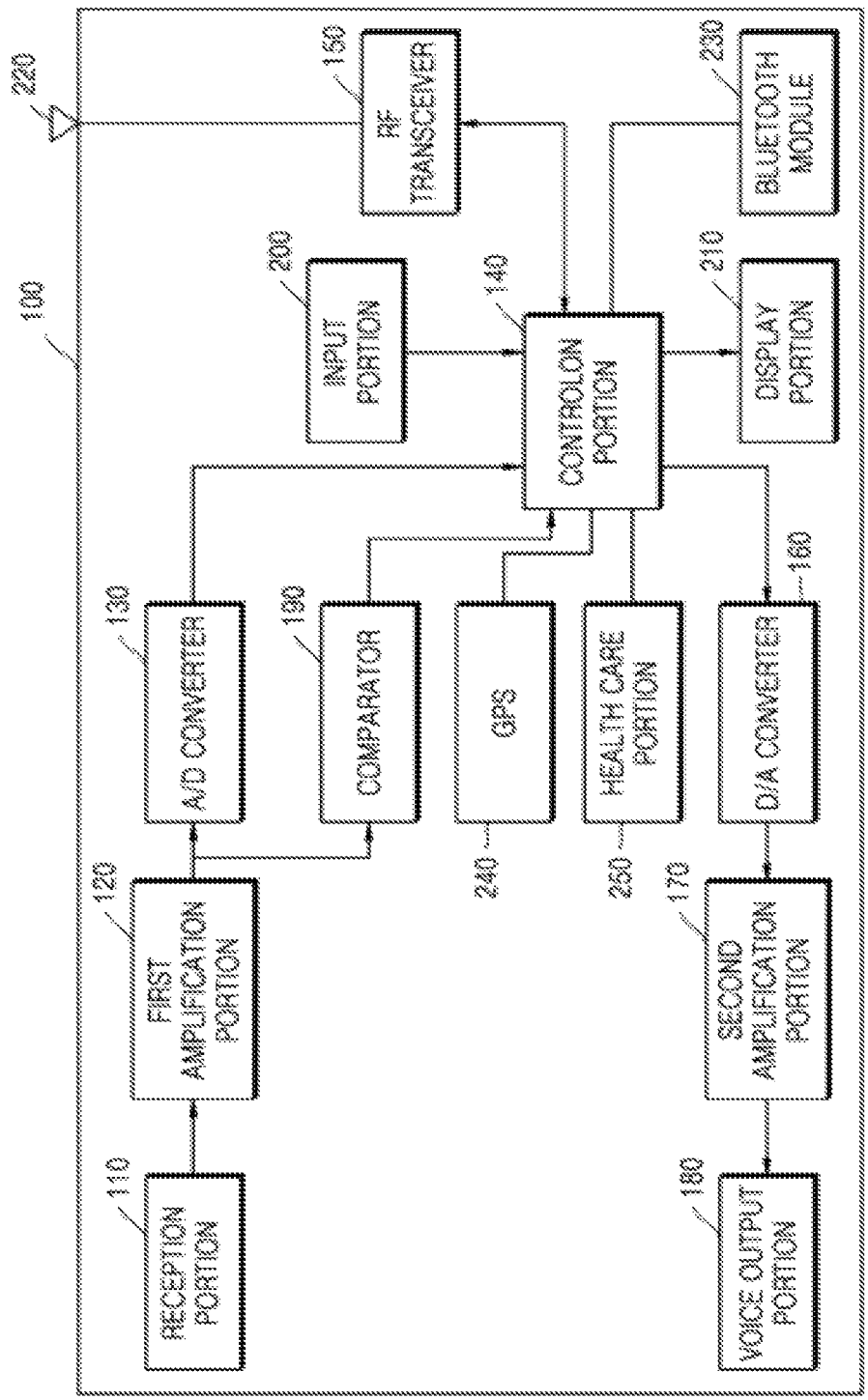
FIG. 1 is a block diagram illustrating components of a smart watch having a digital radio function according to one embodiment of the present invention.

Hereinafter, exemplary embodiments of the present invention will be described in detail with reference to the drawings. Hereinafter, in the description and the attached drawings, substantially like elements will be referred to as like reference numerals and a repetitive description thereof will be omitted. Also, in a description of the embodiments of the present invention, a detailed description of well-known functions or components of the related art will be omitted when it is deemed to obscure understanding of the embodiments of the present invention.

It should be understood that the embodiments of the present invention differ from one another but are not mutually exclusive. For example, a particular shape, structure, and feature disclosed in one embodiment will be implemented as another embodiment without departing from the concept and scope of the present invention. Also, it should be understood that a position or disposition of each of components included in the embodiments of the present invention may be changed without departing from the concept and scope of the present invention.

Accordingly, a following detailed description is not regarded as a limitative meaning, and the scope of the present invention is defined only through the content of the claims and equivalents thereof on the premise of an appropriate description. In the drawings, like reference numerals refer to like or similar functions throughout a variety of aspects.

As the terms used herein, general terms, which are widely and currently used, are selected in consideration of functions in the present invention, which may vary according to the intentions of those skilled in the art, precedents, the appearance of new technologies, or the like. Also, in a particular case, the terms arbitrarily selected by the applicant are present. In this case, a detailed meaning thereof will be set forth in a description of a corresponding part of the present invention. Accordingly, the terms used herein should be defined on the basis of meanings thereof and the content throughout an entirety of the present invention instead of simple designation of the terms.

Throughout the specification, when a portion is stated as "including" a component, unless defined particularly otherwise, it means that the portion may not exclude another component but may further include another component. Also, the terms such as "portion," "module," and the like disclosed herein refer to a unit configured to perform at least one function or operation and may be implemented as hardware, software, or a combination thereof.

FIG. 1 is a block diagram illustrating components of a smart watch having a digital radio function according to one embodiment of the present invention.

As shown in the drawing, a smart watch 100 having a digital radio function according to one embodiment of the present invention includes a reception portion 110, a first amplification portion 120, an analog/digital (A/D) converter 130, a control portion 140, a radio frequency (RF) transceiver 150, a D/A converter 160, a second amplification portion 170, a voice output portion 180, and an antenna 220. Also, the smart watch 100 having the digital radio function according to one embodiment may further include a comparator 190, an input portion 200, a display portion 210, a Bluetooth module 230 configured to perform Bluetooth communication with a smart phone or the like, a global positioning system (GPS) portion 240 which recognizes a position using a GPS signal, and a health care portion 250 capable of performing health care functions such as measuring a cardiac rate, measuring a blood sugar level, calculating calories, and the like.

The reception portion 110 is a portion to which an analog voice signal is input. That is, a user of the smart watch 100 having the digital radio function inputs a voice through the reception portion 110. Also, the reception portion 110 may be a general microphone.

The first amplification portion 120 amplifies an analog voice signal input through the reception portion 110.

The A/D converter 130 converts the amplified analog voice signal output by the first amplification portion 120 into a digital voice signal.

The control portion 140 representative of at least a processor receives and outputs the digital voice signal output by the A/D converter 130 to the RF transceiver 150. Also, the control portion 140 outputs the digital voice signal received through the antenna 220 and input through the RF transceiver 150. Here, the digital voice signal received through the antenna 220 corresponds to a digital voice signal which is transmitted from another device having a digital radio function, for example, the smart watch according to the embodiment of the present invention or another radio device or is transmitted from another device in addition thereto.

Also, the control portion 140 enables full duplex communication with another device having a digital radio function by controlling a time sharing function of the antenna 220.

Also, the control portion 140 may set a group of other devices having a digital radio function and capable of performing communication using a sharing function by a code combination such that communication may be performed only among the devices having the digital radio function in the set group.

The RF transceiver 150 controls inputting of a signal received by the control portion 140 through the antenna 220 and transmission of a signal output from the control portion 140 through the antenna 220.

The D/A converter 160 converts the digital voice signal output from the control portion 140 into an analog voice signal.

The second amplification portion 170 amplifies the analog voice signal output from the D/A converter 160.

The voice output portion 180 transmits the analog voice signal output from the second amplification portion 170 to the outside. That is, the user of the smart watch 100 having the digital radio function hears a corresponding user voice transmitted from another device having the digital radio function or another device through the voice output portion 180. The voice output portion 180 may be a general speaker.

The comparator 190 is connected in parallel with the A/D converter 130 to an output end of the first amplification portion 120 and distinguishes whether voice data is present in the amplified analog voice signal output by the first amplification portion 120. Also, the control portion 140 is connected in parallel with the A/D converter 130 and the comparator 190 and automatically outputs a digital voice signal input from the A/D converter 130 to the RF transceiver 150 according to a signal input from the comparator 190.

That is, since the smart watch 100 having the digital radio function determines whether voice data is present in an output signal of the first amplification portion 120 using an output signal of the comparator 190 and automatically outputs the corresponding voice data to the RF transceiver 150 to externally transmit the voice data through the antenna 220 when the voice data is present, the user of the smart watch 100 having the digital radio function may automatically transmit a voice input to the reception portion 110 to the outside through the antenna 220 without operating a push-to-talk (PTT) button or the like.

The input portion 200 performs a function of inputting signals including PTT to the control portion 140 and may include a variety of buttons and the like including the PTT button.

The display portion 210 is connected to the control portion 140 and displays a system setting value and status information of the smart watch 100 having the digital radio function on a screen. That is, the user of the smart watch 100 having the digital radio function may perform various settings on the smart watch 100 having the digital radio function through the display portion 210 and may visually recognize a current setting state and an operation state of the smart watch 100 having the digital radio function which is being used.

According to an embodiment, a smart phone paired with the smart watch 100 having the digital radio function (particularly, an application installed in the smart phone and linked with the smart watch 100) may access the control portion 140 through Bluetooth communication and may display and change the system setting value and status information of the smart watch 100 having the digital radio function on a display screen. That is, the user of the smart watch 100 having the digital radio function may perform various settings on the smart watch 100 having the digital radio function through the application installed in the smart phone paired with the smart watch 100 and may visually recognize a current setting state and an operation state of the smart watch 100 having the digital radio function which is being used.

Also, the control portion 140 may output a signal output to the RF transceiver 150 while the signal is divided into a basic packet and a control INST packet.

FIGS. 2 and 3 are views illustrating a basic packet and a control INST packet of the smart watch 100 having the digital radio function according to one embodiment of the present invention.

As shown in the drawings, the basic packet is a transmission/reception digital basic frame including voice data, and the control INST packet including a control instruction set necessary in addition to voice data transmission which may be consecutively and separately transmitted to the basic packet whenever an instruction occurs.

Also, the basic packet may include a preamble, a starter code, a transmission ID, a reception ID, a pairing code functioning as a password, a control INST, voice data, and a completion code. The control INST packet may include a packet delay, a slot number, a slot ranking, a master, a slave, remote transmission, Reserve 1, and Reserve 2. In an additional description of the pairing code, when the pairing codes coincide, a call with another device having the digital radio function is connected.

Also, the master and the slave of the control INST packet include information on a master that distributes a control instruction set and information on a slave that receives the control instruction set distributed by the master and include information that the master transfers authority of distributing the control instruction set to a particular slave. This may form a master-slave relationship between two or more devices having the digital radio function. Also, a master function may be transferred to a particular device having the digital radio function through a particular device having the digital radio function which functions as a master such that communication may be performed between devices having the digital radio function on the basis thereon.

Also, the remote transmission of the control INST packet may include information on transmission control and exclusive reception of a master with respect to a particular slave. Through this, a particular device having the digital radio function which functions as a master may remotely control a signal transmission and reception function of a particular device having the digital radio function among other devices having the digital radio function in a communication group, and communication among devices having the digital radio function in the corresponding communication group may be performed on the basis thereof.

Also, a maximum time slot Tn of the basic packet may equal a packet delay/a slot number T/n (here, the slot number n is an integer smaller than <a maximum transmission velocity/a general voice sampling velocity of 20 kbps> and is extensible through data compression as necessary).

Also, the slot number n and a slot ranking N are indicated in the slot number and the slot ranking of the control INST packet such that when a number of communicators in the communication group exceeds the slot number n, a new communicator may enter the slot number instead of a communicator of the last ranking N to perform communication (here, a communicator with a slot number exceeding n in the group may also always perform reception from all the communicators).

Figure 4:
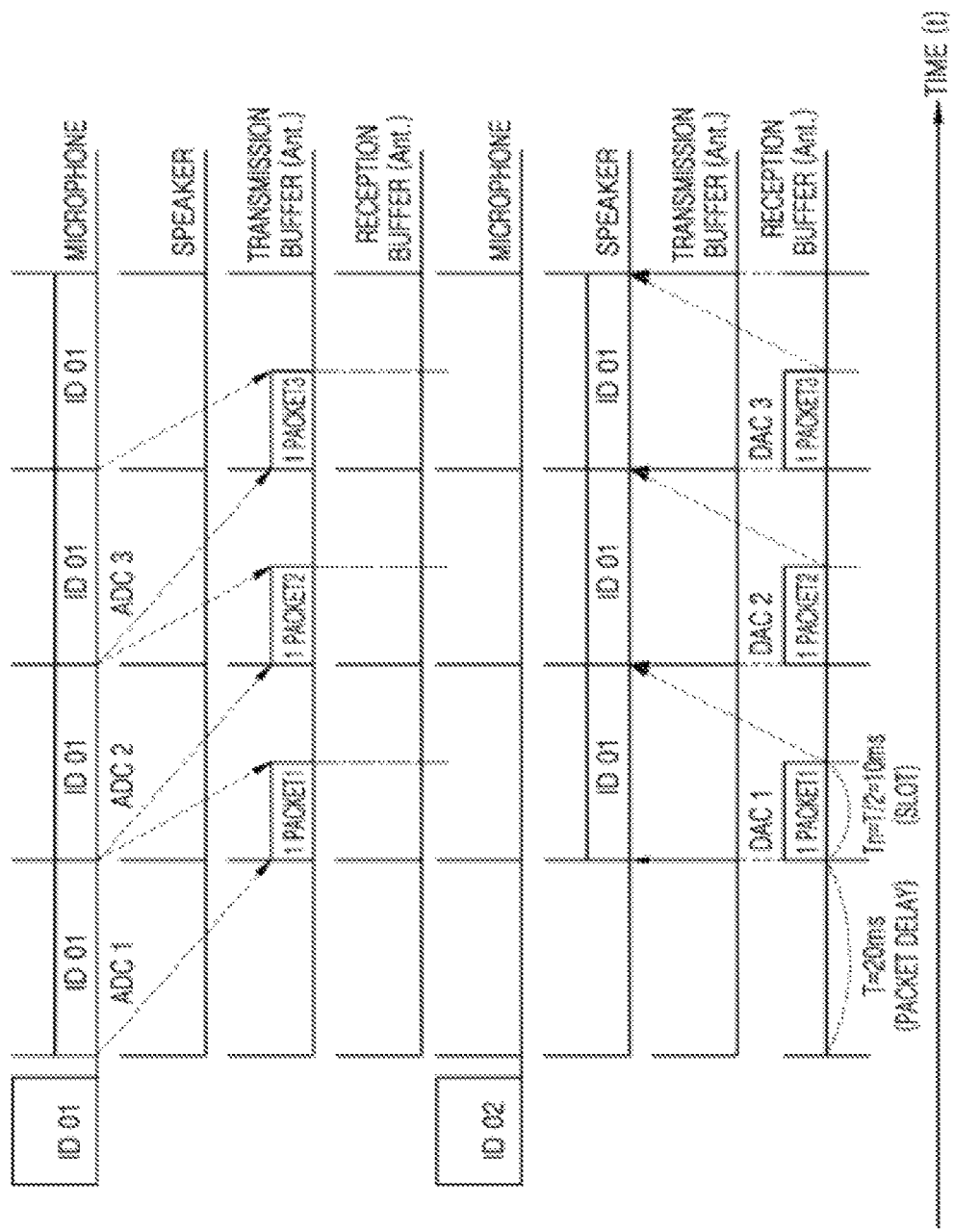
FIGS. 4 to 6 are communication timing diagrams of the smart watch having the digital radio function according to one embodiment of the present invention.
Figure 5:
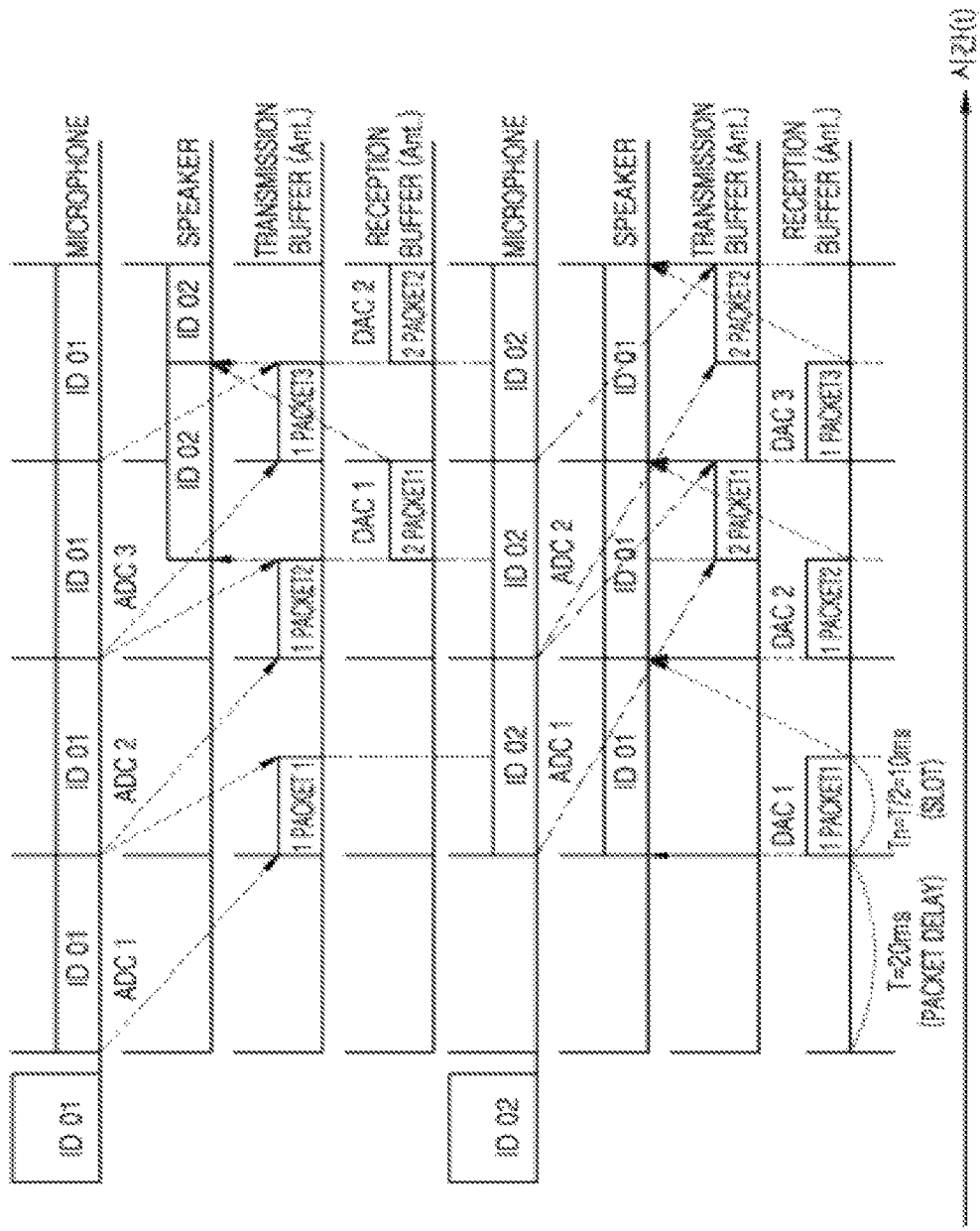
Figure 6:
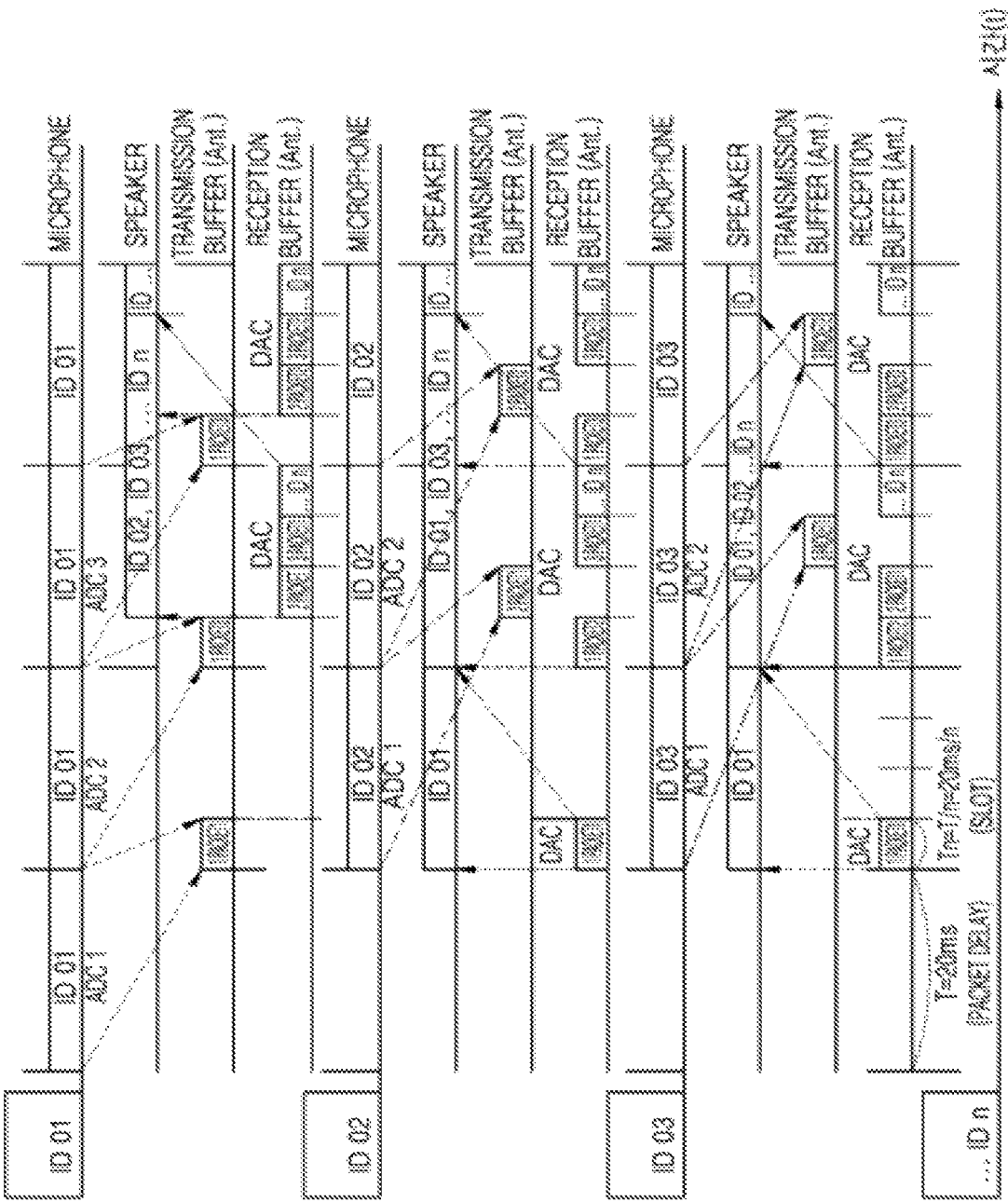

Also, FIGS. 4 to 6 are communication timing diagrams of the smart watch 100 having the digital radio function according to one embodiment of the present invention. FIG. 4 illustrates an example of transmitting packets from the smart watch 100 having ID 01 to another smart watch 100 having ID 02 using a time sharing method.

FIG. 5 illustrates a process in which communication is performed between the smart watch 100 having ID 01 and the other smart watch 100 having ID 02 through one-to-one type full duplex communication and time sharing type packet transmission.

FIG. 6 illustrates a process in which communication is performed among the smart watches 100 having ID 01 to ID n through one-to-n type full duplex communication and time sharing type packet transmission.

Referring back to FIG. 1, in a standby status for receiving a signal from another device having the digital radio function through the antenna 220 or a standby status for receiving an analog voice signal from the other device through the reception portion, the control portion 140 may remain in a sleep mode for a preset time and then operate in an auto-polling mode for a preset time to repetitively perform conversion into the sleep mode and the auto-polling mode so as to reduce power consumption while standing by for reception.

Figure 7:
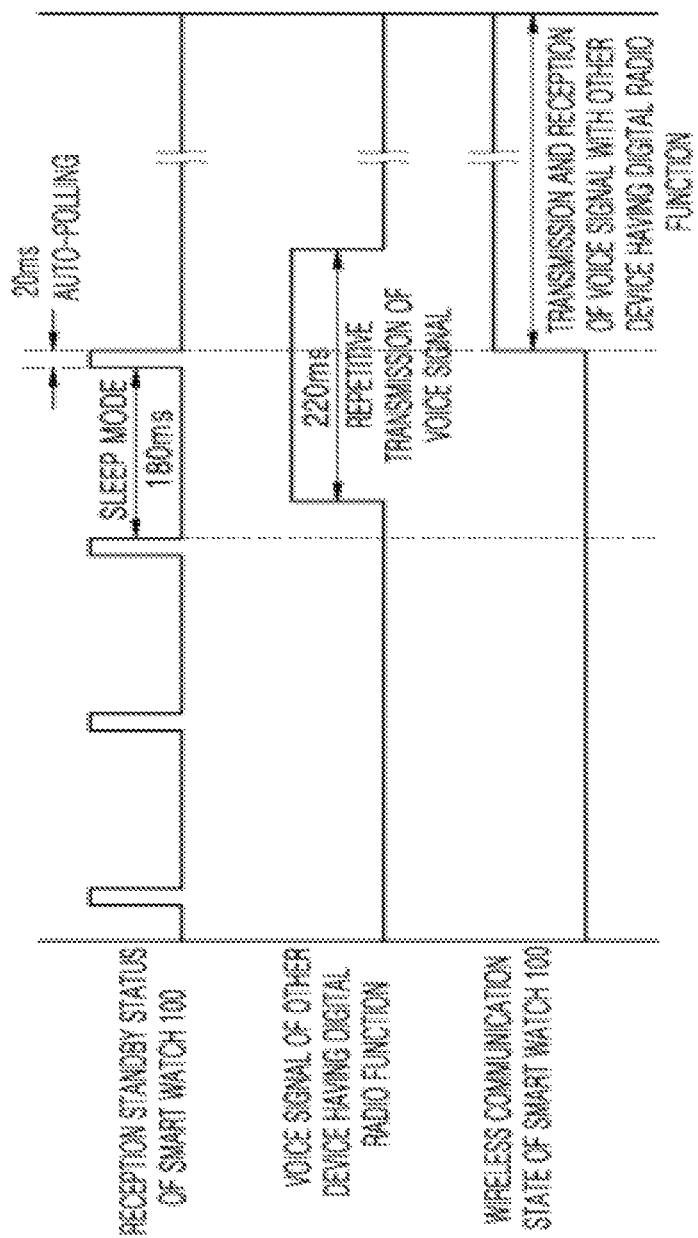
FIG. 7 is a view illustrating an example of a signal standby status in the smart watch having the digital radio function according to one embodiment of the present invention.
Figure 8:
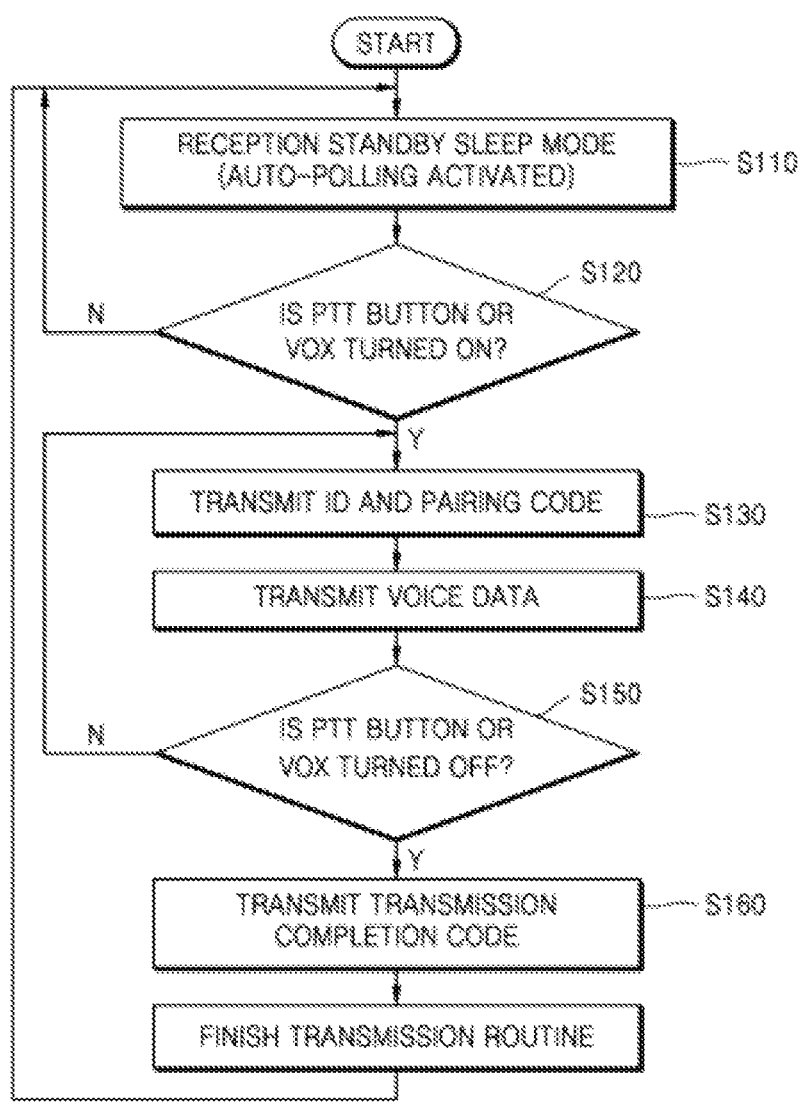
FIG. 8 is a flowchart illustrating a signal transmission process of the smart watch having the digital radio function according to one embodiment of the present invention.

FIG. 7 illustrates the above and FIG. 8 is a view illustrating an example of a signal standby status in the smart watch 100 having the digital radio function according to one embodiment of the present invention.

As shown in the drawing, a reception standby mode of the smart watch 100 having the digital radio function includes a sleep mode section and an auto-polling section. That is, in the reception standby mode of the smart watch 100 having the digital radio function, the sleep mode section and the auto-polling section form one cycle and the one cycle of the sleep mode section and the auto-polling section is repetitively performed before a voice signal is received from another device having the digital radio function. In the embodiment, a set time for maintaining the sleep mode of the reception standby mode is set as 180 ms and a set time for maintaining the auto-polling mode is set as 20 ms such that one cycle is overall 200 ms and repetitively performed before a voice signal is received from another device having the digital radio function.

Also, the other device having the digital radio function may repetitively transmit a voice signal for each preset time of 220 ms. Accordingly, since the time of 20 ms in which the auto-polling is maintained in the reception standby mode of the smart watch 100 is overlapped within a range of 220 ms which is the set time in which the voice signal is transmitted from the other device having the digital radio function, the smart watch 100 may receive the voice signal transmitted from the other device having the digital radio function and then transmit and receive a voice signal with the smart watch 100.

Accordingly, the smart watch 100 having the digital radio function may greatly reduce power consumption in the reception standby status using the auto-polling method in comparison to an existing reception standby mode of always operating in an active status.

Also, the control portion 140 may transmit communication group setting information to other devices having the digital radio function within a communication range or a limited range to allow the smart watch 100 having the digital radio function to set a communication group with other devices having the digital radio function. In order to set the communication group with the other devices having the digital radio function within the limited range, the control portion 140 may convert the communication group setting information into a dual-tone multi-frequency (DTMF) signal and transmit the DTMF signal through the voice output portion 180 or may transmit communication group setting information including a certain received signal strength indicator (RSSI) value through the antenna 220. These operations will be described below in detail with reference to FIGS. 12 to 14.

As seen from the above components, the smart watch 100 having the digital radio function according to one embodiment of the present invention may perform transmission and reception at the same time through the full duplex communication function of the control portion 140 using a time sharing method and the like.

Also, since communication is available only among devices having the digital radio function in a communication group set through a division function of the control portion 140 using a code combination, the communication among the devices having the digital radio function in the corresponding communication group may be performed in a clear state in which noise and crosstalk are prevented as much as possible.

Also, power consumption in the reception standby status may be greatly reduced through a function of the control portion 140 in which one cycle including the sleep mode and the auto-polling mode is repetitively performed in the reception standby status.

Also, through the comparator 190 and a function of the control portion 140 in which whether an analog voice signal exists in a signal input through the reception portion 110 using a signal of the comparator 190, the user of the smart watch 100 having the digital radio function may automatically transmit a voice signal input to the reception portion 110 through the RF transceiver 150 and the antenna 220 of the smart watch 100 having the digital radio function without an additional manipulation on a PTT button or the like for inputting a voice.

Next, a wireless communication method of the smart watch 100 having the digital radio function according to one embodiment of the present invention will be described with reference to FIGS. 8 to 15.

FIG. 8 is a flowchart illustrating a signal transmission process of the smart watch 100 having the digital radio function according to one embodiment of the present invention.

As shown in the drawing, in operation S110, the reception portion 110 stands by for inputting of an analog voice signal.

In operation S120, the control portion 140 determines whether a PTT signal is input through the input portion 200 or whether a voice data presence signal is input through the comparator 190.

In operation S130, when it is determined in operation S120 that the PTT signal is input through the input portion 200 or the voice data presence signal is input through the comparator 190, the control portion 140 outputs ID and a pairing code of the smart watch 100 having the digital radio function to the RF transceiver 150.

In operation S140, the control portion 140 outputs a digital voice signal obtained by converting, by the A/D converter 130, the signal input through the reception portion 110 to the RF transceiver 150.

In operations S130 and S140, the ID and pairing code of the smart watch 100 having the digital radio function and the digital voice signal are transmitted to another device having the digital radio function through the antenna 220.

In operation S150, the control portion 140 determines whether inputting of the PTT signal is stopped or whether inputting of the voice data presence signal through the comparator 190 is stopped.

Figure 9:
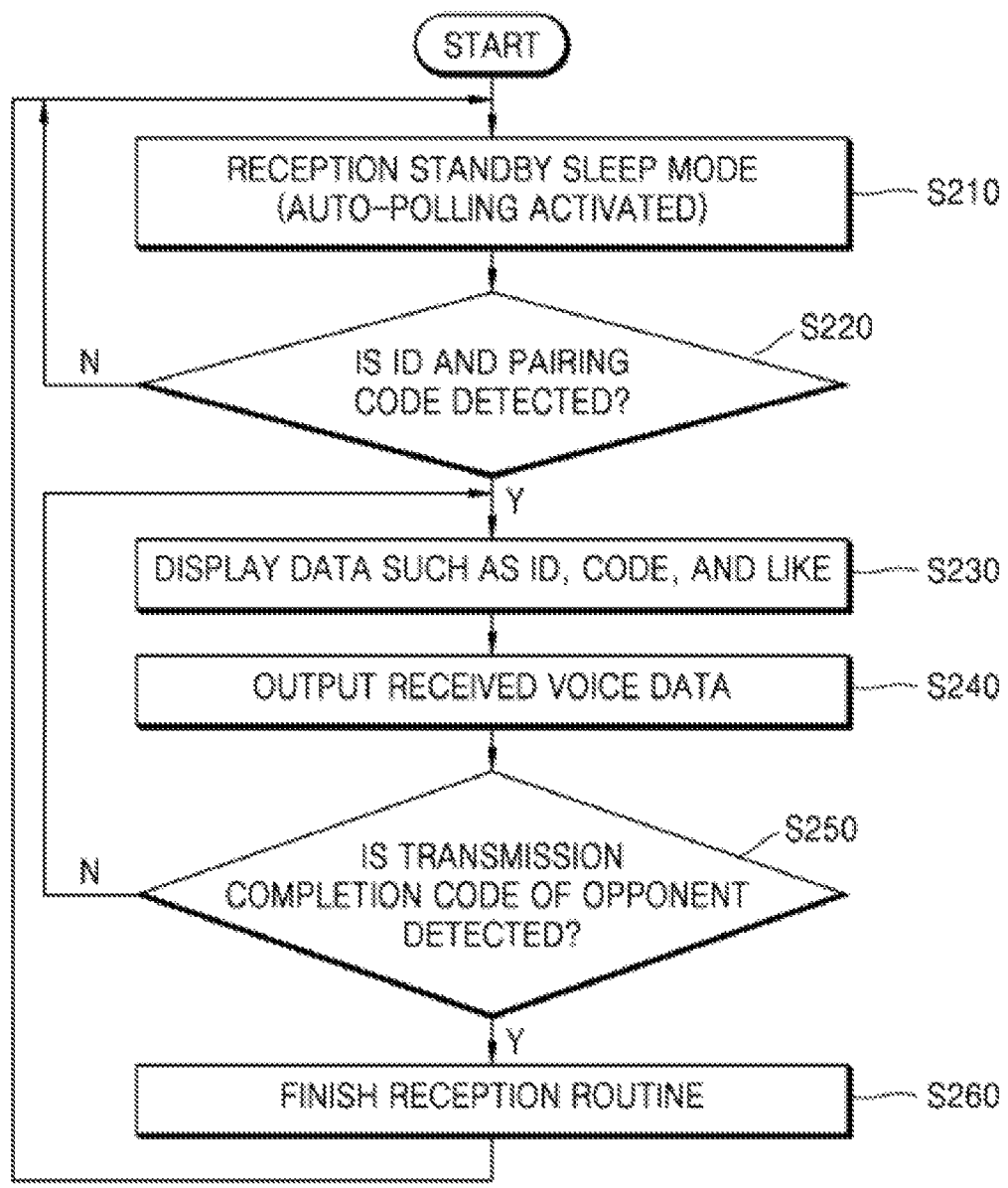
FIG. 9 is a flowchart illustrating a signal reception process of the smart watch having the digital radio function according to one embodiment of the present invention.

In operation S160, when it is confirmed in operation S150 that inputting of the PTT signal is stopped or inputting of the voice data presence signal through the comparator 190 is stopped, the control portion 140 outputs a transmission completion code to the RF transceiver 150. Accordingly, the transmission completion signal is transmitted to the other device having the digital radio function through the antenna 220 of the smart watch 100 having the digital radio function such that a transmission routine between the devices having the digital radio function is finished. FIG. 9 is a flowchart illustrating a signal reception process of the smart watch 100 having the digital radio function according to one embodiment of the present invention.

As shown in the drawing, in operation S210, the antenna 220 stands by for inputting of a digital voice signal.

In operation S220, the control portion 140 determines whether a signal received through the antenna 220 includes ID and a pairing code of another device having the digital radio function.

In operation S230, when it is determined in operation S220 that the signal received through the antenna 220 includes the ID and pairing code of the other device having the digital radio function, the control portion 140 displays the ID and pairing code of the other device having the digital radio function through the display portion 210.

In operation S240, the control portion 140 outputs an input digital voice signal of the other device having the digital radio function to the D/A converter 160, and an analog voice signal obtained through conversion performed by the D/A converter 160 is output through the voice output portion 180.

In operation S250, the control portion 140 determines whether a transmission signal of the other device having the digital radio function includes a transmission completion code.

In operation S260, when it is confirmed that the transmission signal of the other device having the digital radio function includes the transmission completion code, the control portion 140 finishes a signal reception operation.

Figure 10:
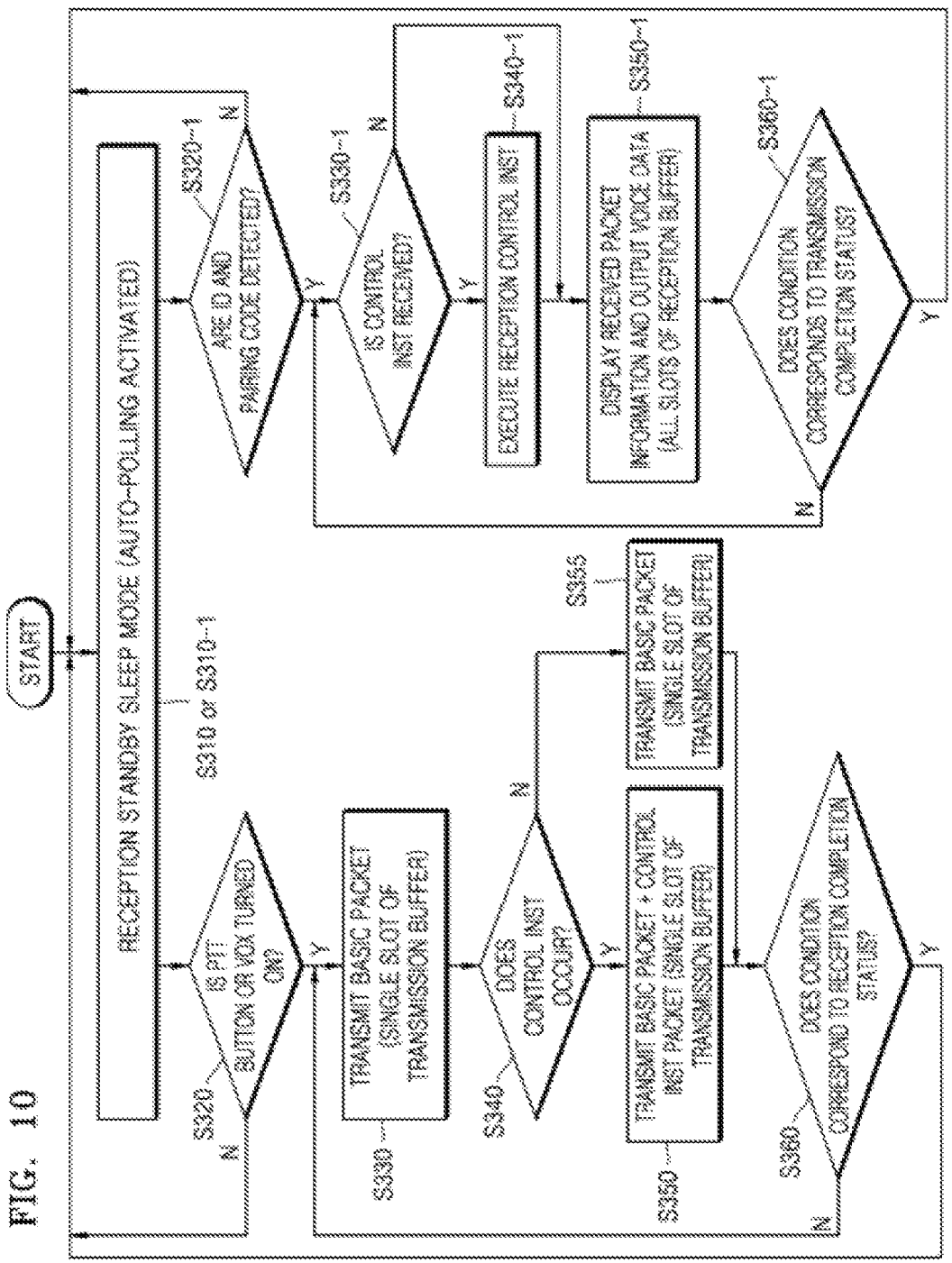
FIG. 10 is flowchart illustrating a process in which full duplex communication is performed in the smart watch having the digital radio function according to one embodiment of the present invention.

FIG. 10 is flowchart illustrating a process in which full duplex communication is performed in the smart watch 100 having the digital radio function according to one embodiment of the present invention.

First, in a description of a transmission routine, as shown in the drawing, in operation S310, the reception portion 110 stands by for inputting of an analog voice signal.

In operation S320, the control portion 140 determines whether a PTT signal is input through the input portion 200 or whether a voice data presence signal is input through the comparator 190.

In operation S330, when the PTT signal is input or the voice data presence signal is input, the control portion 140 outputs a basic packet to the RF transceiver 150.

In operation S340, it is determined whether the control portion 140 should generate a control INST.

In operation S350, when it is determined that the control portion 140 will generate the control INST, the basic packet including a control INST packet is output to the RF transceiver 150. Otherwise, in operation S355, it is determined that the control portion 140 will not generate the control INST, the basic packet is continuously output to the RF transceiver 150.

In operation S360, the control portion 140 determines whether transmission is finished, that is, determines whether a condition corresponds to a status in which another device having the digital radio function finishes reception.

Also, when the control portion 140 determines that transmission is finished, there is performed an operation before the operation of standing by for inputting of the analog voice signal through the reception portion 110. When the control portion 140 does not determine that the transmission is finished, there is performed an operation before the operation of outputting, by the control portion 140, the basic packet to the RF transceiver 150 when the PTT signal is input or the voice data presence signal is input.

Next, in a description of a reception routine, in operation S310-1, the antenna 220 stands by for inputting of a digital voice signal.

In operation S320-1, the control portion 140 determines whether a signal received through the antenna 220 includes ID and a pairing code of another device having the digital radio function.

In operation S330-1, when it is determined that the signal received through the antenna 220 includes the ID and pairing code of the other device having the digital radio function, the control portion 140 determines whether a control INST is received with the corresponding signal.

In operation S340-1, when the control portion 140 determines that the control INST is also received, the received INST is executed.

In operation S350-1, as the control portion 140 executes the control INST, received packet information is output through the display portion 210 and voice data is output through the voice output portion 180.

In operation S360-1, the control portion 140 determines whether reception is finished, that is, determines whether a condition corresponds to a status in which another device having the digital radio function finishes transmission.

Also, when the control portion 140 determines that the reception is finished, there is performed an operation before the operation of standing by, by the antenna 220, for inputting of the digital voice signal. When the control portion 140 does not determine that the reception is finished, there is performed an operation before the operation of determining, by the control portion 140, whether the control INST is also received with the corresponding signal when the signal received through the antenna 220 includes the ID and pairing code of the other device having the digital radio function.

Figure 11:
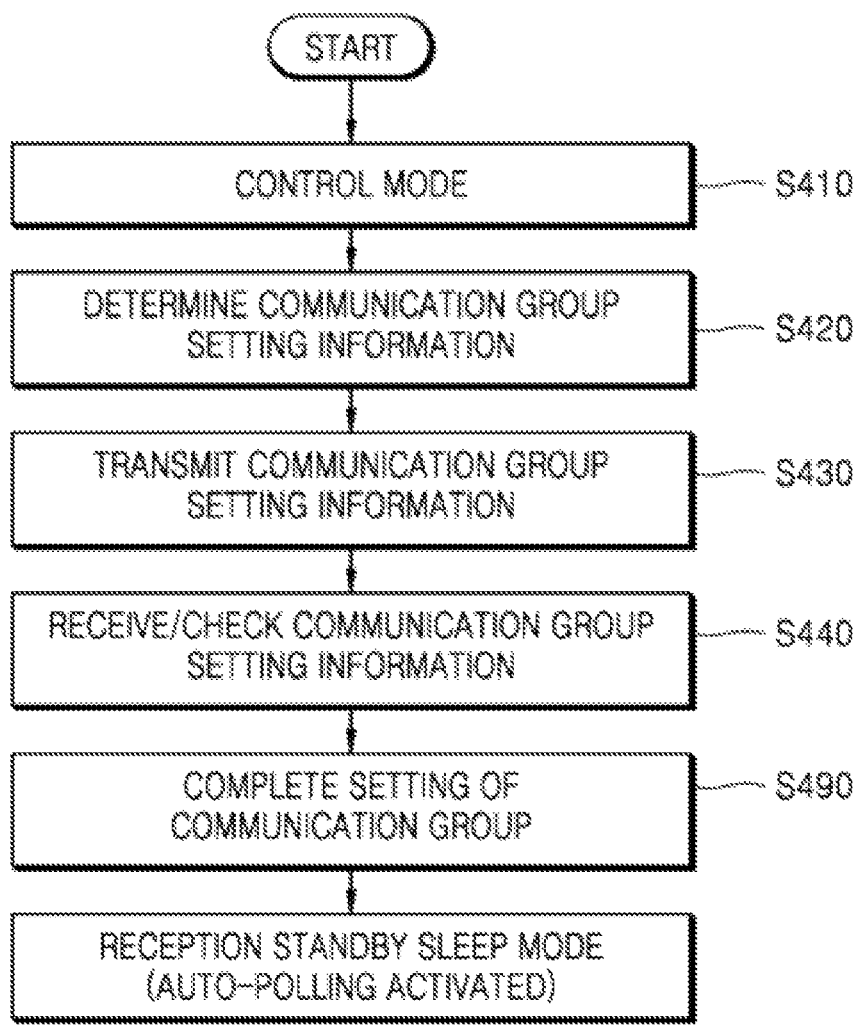
FIG. 11 is a flowchart illustrating an embodiment of a communication group setting method of the smart watch having the digital radio function according to one embodiment of the present invention.

FIG. 11 is a flowchart illustrating an embodiment of a communication group setting method of the smart watch 100 having the digital radio function according to one embodiment of the present invention.

In operation S410, the smart watch 100, which intends to set a communication group, is set to be in a control mode.

Figure 12:
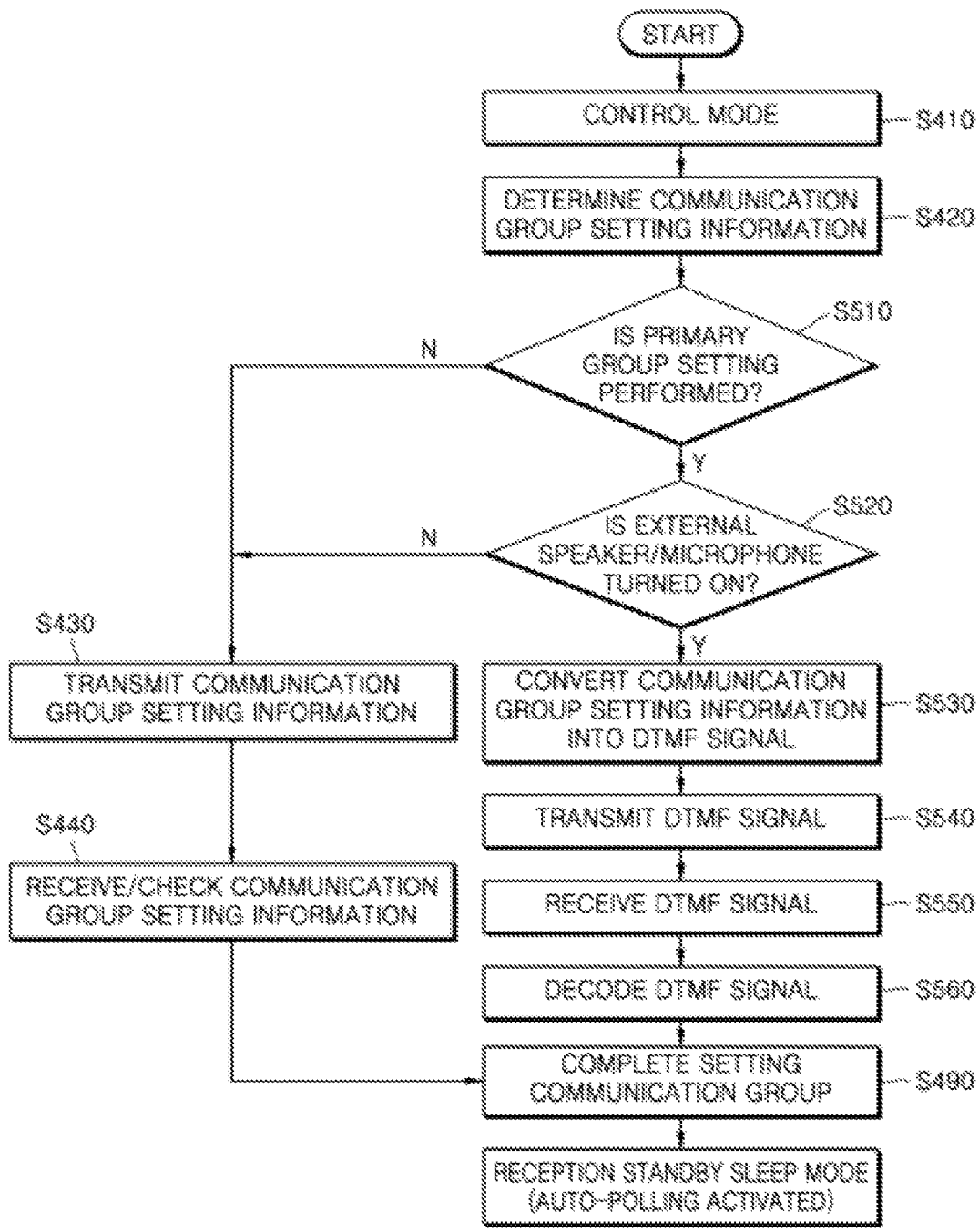
FIG. 12 is a flowchart illustrating another embodiment of the communication group setting method of the smart watch having the digital radio function according to one embodiment of the present invention.

In operation S420, the control portion 140 representative of at least a processor that implements a predetermined algorithm including that of FIG. 12 of the smart watch 100 is configured to determine communication group setting information of the communication group to be set. The communication group setting information may include, for example, ID, a pairing code, a master, a slave, a control INST, and the like of a device having the digital radio function to be included in the communication group.

In operation S430, the control portion 140 of the smart watch 100 transmits the communication group setting information through the RF transceiver 150 and the antenna 220.

In operation S440, other devices having the digital radio function receive the communication group setting information and check the received communication group setting information when approval (or implied approval) of corresponding users for joining the group is present.

In operation S490, the other devices having the digital radio function store and set the received communication group setting information such that a communication group including the smart watch 100 and the other devices having the digital function is set.

Also, the smart watch 100 and the other devices having the digital radio function are converted into a reception standby mode. Then, communication becomes available among the devices having the digital radio function which are included in the communication group.

According to the communication group setting method according to the embodiment of FIG. 11, a communication group may be set among devices having the digital radio function within a range in which the communication group setting information is transmittable, that is, within a communication range of the smart watch 100 intended to set a communication group. However, on a case by case basis, it is necessary to set a communication group among devices having the digital radio function in a so-called private communication group, that is, within a limited range smaller than a wireless communication range. For example, a communication group is set which includes people gathered within several meters to several ten meters. According to the communication group setting method according to the embodiment of FIG. 11, since the communication group setting information is transferred to all devices having the digital radio function within a communication range, an undesirable person may be included in the communication group or a person not be included for security may be included in the communication group. Other embodiments of the present invention provide communication group setting methods capable of effectively setting a communication group among wireless communication devices within a limited range smaller than a wireless communication range.

FIG. 12 is a flowchart illustrating another embodiment of a communication group setting method of the smart watch 100 having the digital radio function according to one embodiment of the present invention.

In operation S410, the smart watch 100, which intends to set a communication group, is set to be in a control mode.

Figure 14:
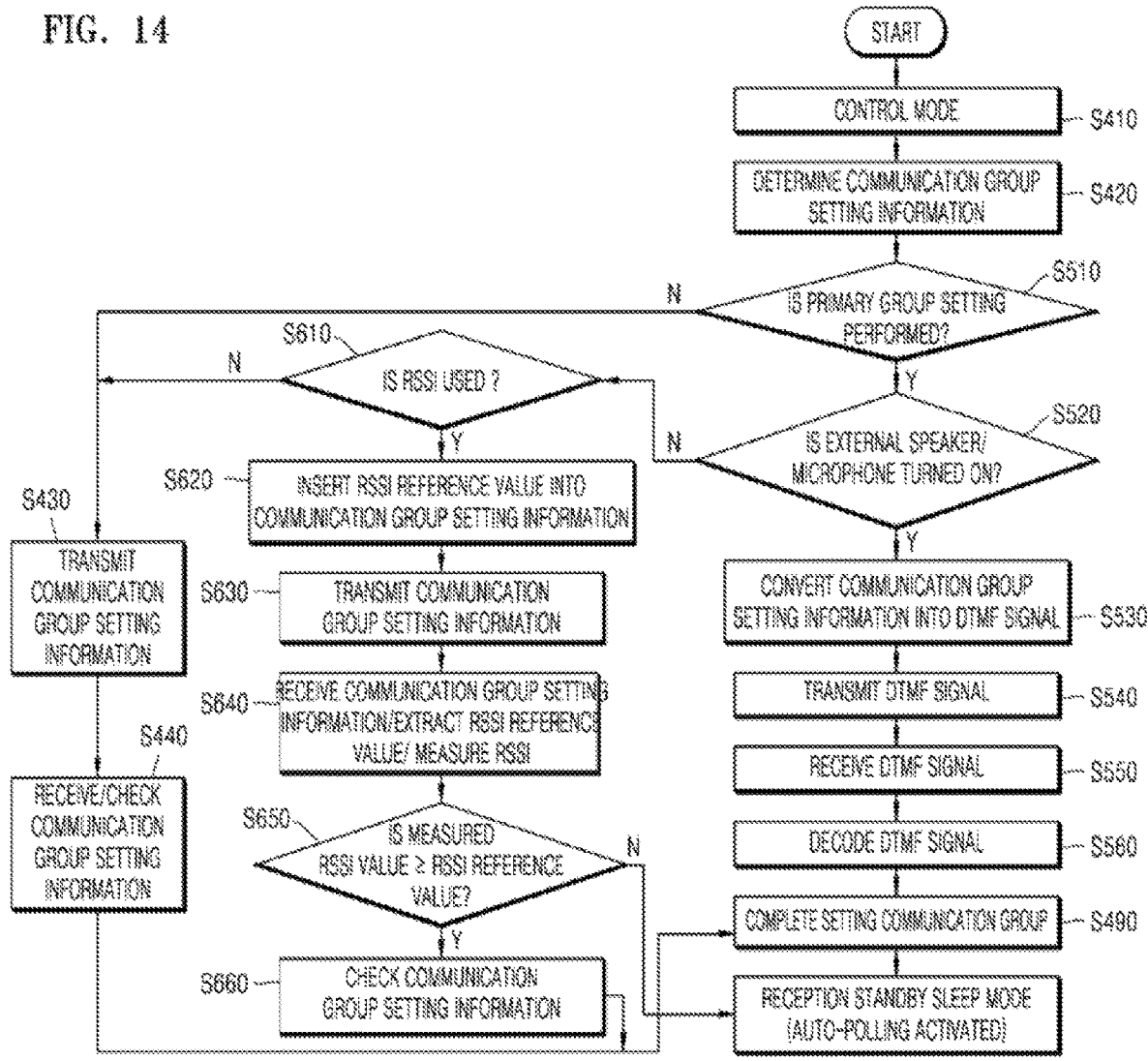
FIG. 14 is a flowchart illustrating still another embodiment of the communication group setting method of the smart watch having the digital radio function according to one embodiment of the present invention.

In operation S420, the control portion 140 representative of at least a processor that implements a predetermined algorithm including that of FIG. 14 of the smart watch 100 is configured to determine communication group setting information of the communication group to be set. The communication group setting information may include, for example, ID, a pairing code, a master, a slave, a control INST, and the like of a wireless communication device to be included in the communication group.

In operation S510, the control portion 140 of the smart watch 100 determines whether communication group setting is primary group setting. Here, when a communication group is already set, the setting of the communication group may not be determined as primary group setting. When a communication group is not currently set, setting may be determined as primary group setting.

When the setting is not primary group setting, like the embodiment of FIG. 11, the control portion 140 of the smart watch 100 transmits the communication group setting information through the RF transceiver 150 and the antenna 220 (S430). In this case, operation S430 may be, for example, transmitting new communication group setting information to devices having the digital radio function in an already set communication group.

When the setting is the primary group setting, the control portion 140 of the smart watch 100 transmits the communication group setting information to devices having the digital radio function within a limited range using a DTMF signal by performing operation S520 as follows. In the embodiment, the DTMF signal is transmitted as a sound through the voice output portion 180, for example, a speaker. Here, since a sound arrives within only a limited distance, it is possible to set a communication group among the devices having the digital radio function within the limited range.

In operation S520, the control portion 140 of the smart watch 100 checks whether an external speaker and a microphone of the smart watch 100 are turned on. Since it is impossible to transmit a sound when the external speaker and microphone are not present or not being turned on, the control portion 140 of the smart watch 100 transmits the communication group setting information through the RF transceiver 150 and the antenna 220 (S430).

When the external speaker and microphone are being turned on, in operation S530, the control portion 140 of the smart watch 100 converts the communication group setting information into a DTMF signal. For example, when the DTMF signal has frequency components of a 4×4 matrix, a hexadecimal value may be expressed with an overlapping tone (a combination of two frequencies). FIG. 13 is a view illustrating an example of the DTMF signal, in which each row indicates a low frequency component and each column indicates a high frequency component. As shown in the drawing, a hexadecimal number of 0 to F may be expressed with frequency components of a 4×4 matrix. For example, when eight hexadecimal data such as ID, a pairing code, a master, a slave, a control INST, and the like of wireless communication devices to be included in a communication group are necessary as communication group setting information, eight DTMF signals (overlapping tones) are generated.

In operation S540, the control portion 140 of the smart watch 100 transmits the DTMF signals to the outside through the voice output portion 180. For example, eight overlapping tones are sequentially transmitted through the voice output portion 180.

Then, in operation S550, other devices having the digital radio function near the smart watch 100 are allowed to receive the DTMF signals through the reception portion 110, for example, a microphone. According to a volume of a sound output through the voice output portion 180 of the smart watch 100 and sensitivity of the reception portion 110 of the other devices having the digital radio function, the DTMF signal may be transmitted within a range of several meters to more than a dozen meters. Accordingly, a communication group of devices having the digital radio function within a range of several meters to more than a dozen meters may be set. When a frequency of the DTMF signal is in an ultrasonic band, it is possible to transmit or receive the DTMF signal at a place with a loud noise around.

In operation S560, the control portion 140 of each of the other devices having the digital radio function which receives the DTMF signal obtains communication group setting information by decoding the received DTMF signal when user's approval for joining the group (or implied approval) is present. For example, the control portion 140 of each of the other devices having the digital radio function may obtain the communication group setting information by restoring corresponding hexadecimal data from the received DTMF signal.

In operation S490, the other devices having the digital radio function store and set the obtained communication group setting information such that a communication group including the smart watch 100 and the other devices having the digital function is set.

Also, the smart watch 100 and the other devices having the digital radio function are converted into a reception standby mode. Then, communication becomes available among the devices having the digital radio function which are included in the communication group.

FIG. 14 is a flowchart illustrating still another embodiment of a communication group setting method of the smart watch 100 having the digital radio function according to one embodiment of the present invention.

In operation S410, the smart watch 100, which intends to set a communication group, is set to be in a control mode.

In operation S420, the control portion 140 of the smart watch 100 determines communication group setting information of the communication group to be set. The communication group setting information may include, for example, ID, a pairing code, a master, a slave, a control INST, and the like of a wireless communication device to be included in the communication group.

In operation S510, the control portion 140 of the smart watch 100 determines whether communication group setting is primary group setting. Here, when a communication group is already set, the setting of the communication group may not be determined as primary group setting. When a communication group is not currently set, the setting may be determined as primary group setting.

When the setting is not primary group setting, like the embodiment of FIG. 11, the control portion 140 of the smart watch 100 transmits the communication group setting information through the RF transceiver 150 and the antenna 220 (S430). In this case, operation S430 may be, for example, transmitting new communication group setting information to devices having the digital radio function in an already set communication group.

In the case of the primary group setting, in operation S520, the control portion 140 of the smart watch 100 checks whether an external speaker and a microphone of the smart watch 100 are turned on. When the external speaker and microphone are turned on, like the embodiment of FIG. 12, the control portion 140 of the smart watch 100 converts the communication group setting information into a DTMF signal (S530) and transmits the DTMF signal to the outside through the voice output portion 180 (S540).

Since it is impossible to use the DTMF signal when the external speaker and microphone are not present or not being turned on in operation S520, operation S610 is performed such that the control portion 140 of the smart watch 100 transmits communication group setting information including a certain RSSI reference value. Then, the other devices having the digital radio function which receive the RSSI reference value may compare the RSSI reference value with a measured RSSI value and determine whether to join the communication group according to a result of comparison. Since the measured RSSI value depends on a distance, it is possible to set a communication group of devices having the digital radio function within a limited range.

According to an embodiment, regardless of whether the external speaker and microphone are usable, an RSSI value may be used without using the DTMF signal. In this case, in a flowchart of FIG. 14, operations S520 to S560 may be omitted. When primary group setting is performed in operation S510, operation S610 may be performed immediately.

In operation S610, the control portion 140 of the smart watch 100 determines whether an RSSI value should be used for setting a communication group. Here, according to a user's instruction or presetting, whether to use the RSSI value may be determined. When it is not determined to use the RSSI value, the control portion 140 of the smart watch 100 transmits the communication group setting information through the RF transceiver 150 and the antenna 220 (S430).

When it is determined to use the RSSI value, the control portion 140 of the smart watch 100 allows a certain RSSI reference value to be included in the communication group setting information. As described above, the communication group setting information may include a control INST. For example, the RSSI reference value may be included in an area of Reserve 1 or Reserve 2 of the control INST packet shown in FIG. 4.

In operation S630, the control portion 140 of the smart watch 100 transmits the communication group setting information including the RSSI reference value through the RF transceiver 150 and the antenna 220.

Then, in operation S640, the other devices having the digital radio function receive the communication group setting information including the RSSI reference value through the antenna 220, and the control portion 140 of each of the other devices having the digital radio function extracts the RSSI reference value from the received communication group setting information while measuring an RSSI value of a received signal.

In operation S650, the control portion 140 of each of the other devices having the digital radio function compares the measured RSSI value with the RSSI reference value extracted from the communication group setting information and determines whether the measured RSSI value is greater than or equal to the RSSI reference value.

When an RSSI value measured while a device having the digital radio function on a transmitting side is very close to a device having the digital radio function on a receiving side is referred to as a maximum RSSI value, an RSSI value measured at a short distance of several ten meters is 90 to 95% the maximum RSSI value and an RSSI value measured at a maximum communication distance of the device having the digital radio function is 5 to 10% the maximum RSSI value. Accordingly, the RSSI reference value may be determined as an adequate value according to a range for setting a communication group and may be changeable according to user's settings. For example, when the range for setting the communication group is several ten meters, the RSSI reference value may be determined as 90% the maximum RSSI value.

When it is determined in operation S650 that the measured RSSI value is greater than or equal to the RSSI reference value, in operation S660, the control portion 140 of each of the other devices having the digital radio function checks the received communication group setting information and obtains the communication group setting information such as ID, a pairing code, a master, a slave, a control INST, and the like of a wireless communication device to be included in the communication group.

Then, in operation S490, the other devices having the digital radio function store and set the communication group setting information such that a communication group including the smart watch 100 and the other devices having the digital function is set.

Also, the smart watch 100 and the other devices having the digital radio function are converted into a reception standby mode. Then, communication becomes available among the devices having the digital radio function which are included in the communication group.

Figure 15:
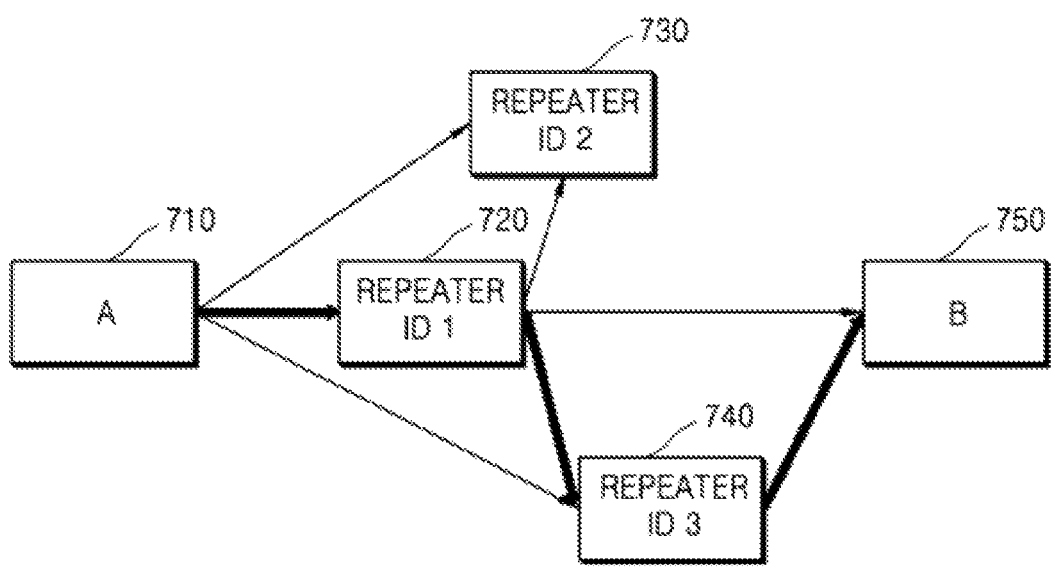
FIG. 15 is a view illustrating the smart watch having the digital radio function according to one embodiment of the present invention which is operated as a repeater or relay.

FIG. 15 is a view illustrating the smart watch 100 having the digital radio function according to one embodiment of the present invention which is being operated as a repeater or relay.

A repeater means a relaying function of performing waveform shaping or amplification such as reproducing a reduced signal, increasing output thereof, and the like to extend transmissions of a wireless signal to be transmitted.

A relay means a function of extending a communication distance or increasing a number of communication terminals by providing one or more repeaters between a sending end and a receiving end.

In the embodiment of the present invention, the smart watch 100 may be set to be in a repeater mode. In the repeater mode, the control portion 140 may change transmission/reception ID, amplify a wireless signal received through the antenna 220 with a certain level of power, and transmit the amplified signal through the antenna 220. Here, two or more smart watches 100 which have received a wireless signal may compare levels of received power through mutual communication such that the smart watch 100 having a highest level of received power may perform a repeater function.

For example, referring to FIG. 15, it is assumed that when smart watches 100 ID 1, ID 2, and ID 3 720, 730, and 740 (hereinafter, referred to as devices ID 1, ID 2, and ID 3 720, 730, and 740) are set to be in a repeater mode, a device A 710 having the digital radio function having the digital radio function transmits a wireless signal. A device B 750 having the digital radio function is present at a long distance from the device A 710 and can not directly receive a wireless signal.

The devices ID 1, ID 2, and ID 3 720, 730, 740 receive a signal from the device A 710 and compare levels of received power through mutual communication. Then, the device ID 1 720 having a highest level of received power amplifies and retransmits a signal from the device A 710. The devices ID 2 and ID 3 730 and 740 each receive the signal transmitted by the device ID 1 720 and compare levels of received power through mutual communication. Then, the device ID 3 740 having a highest level of received power amplifies and retransmits a signal from the device ID 1 720. Then, the device B 750 receives a wireless signal from the device ID 3 740. On a case by case basis, the device B 750 may receive a signal transmitted by the device ID 1 702. Here, since a level of power of the signal transmitted from the device ID 3 740 is higher, the signal transmitted from the device ID 3 740 may be selected.

Figure 16:
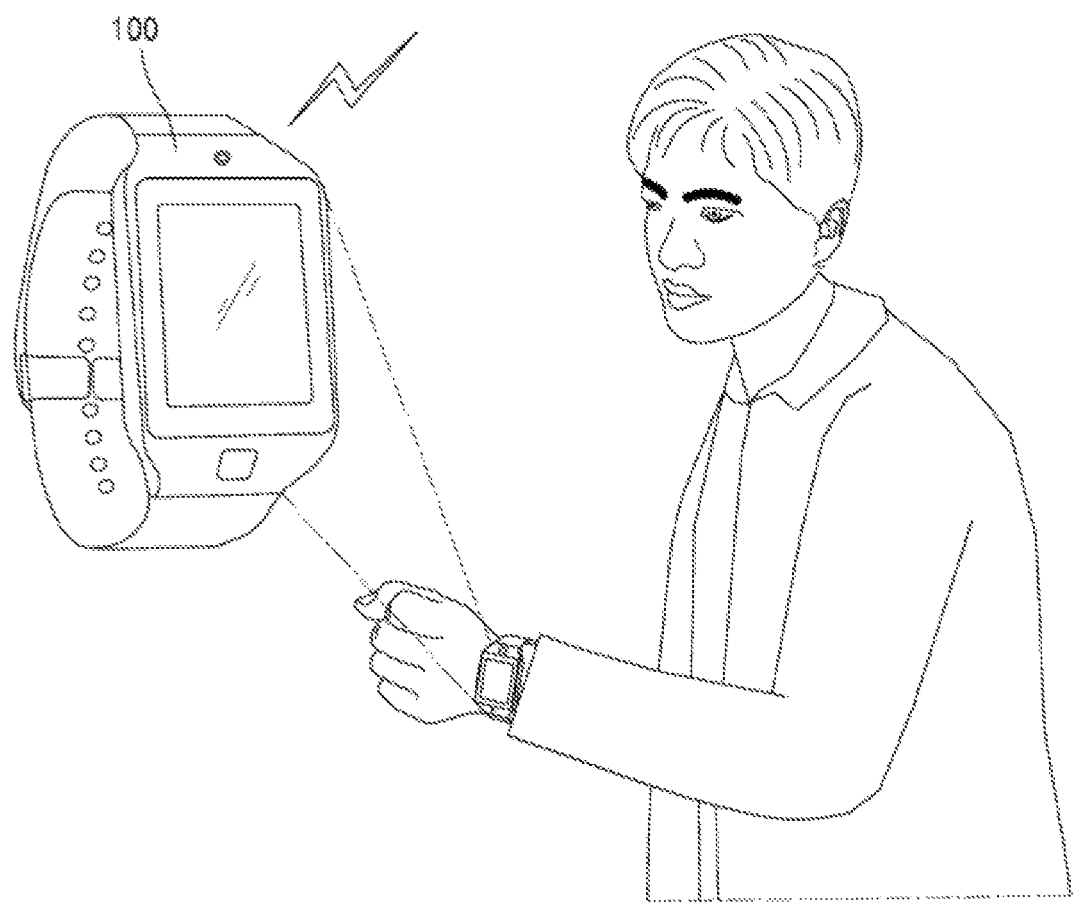
FIG. 16 illustrates an example of a state in which the smart watch having the digital radio function according to one embodiment of the present invention is used.

Consequently, the signal transmitted by the device A 710 is transmitted to the device B 750 via the ID 1 720 and the device ID 3 740. On the other hand, the signal transmitted by the device B 750 is transmitted to the device A 710 through the ID 3 740 and the device ID 1 720. FIG. 16 illustrates an example of a state in which the smart watch 100 having the digital radio function according to one embodiment of the present invention is used. Referring to FIG. 16, a user may communicate with another device having the digital radio function using the smart watch 100 having the digital radio function according to one embodiment of the present invention.

The exemplary embodiments of the present invention have been described above. It should be understood by one of ordinary skill in the art that the present invention may be implemented as a modified form without departing from the essential features of the present invention. Therefore, the disclosed embodiments should be considered not in a limitative view but in a descriptive view. The scope of the present invention will be shown in the claims not in the above description, and all differences within an equivalent range thereof should be construed as being included in the present invention.

The invention claimed is:

1. A smart watch having a digital radio function, comprising:
   a reception portion to which an analog voice signal is input;
   a first amplification portion amplifying the analog voice signal input through the reception portion;
   an analog/digital (A/D) converter converting the amplified analog voice signal output by the first amplification portion into a digital voice signal;
   a comparator connected to an output end of the first amplification portion with the A/D converter in parallel to determine whether voice data is present in the amplified analog voice signal output from the first amplification portion;
   a processor receiving and outputting the digital voice signal output from the A/D converter and outputting a digital voice signal received and input through an antenna;
   a radio frequency (RF) transceiver controlling input of the signal received through the antenna to the processor and transmission of the signal output from the processor through the antenna;
   a digital/analog (D/A) converter converting the digital voice signal output from the processor into an analog voice signal;
   a second amplification portion amplifying the analog voice signal output from the D/A converter; and
   a voice output portion externally transmitting the analog voice signal output from the second amplification portion,
   wherein the processor is configured to:
       determine whether a communication group with other devices is already set, and checks whether an external speaker and a microphone of the smart watch are being turned on,
       convert the communication group setting information into a dual-tone multi-frequency (DTMF) signal to transmit the DTMF signal through the voice output portion so as to set the communication group with other devices having the digital radio function within a limited range, in response to the communication group with other devices being not currently set and the external speaker and the microphone of the smart watch being turned on;
       transmit the communication group setting information including a received signal strength indicator (RSSI) reference value through the RF transceiver and the antenna, in response to the communication group with other devices being not currently set and the external speaker and the microphone of the smart watch being not turned on; and
       transmit communication group setting information through the RF transceiver and the antenna, in response to the communication group with other devices being already set, or the external speaker and the microphone of the smart watch being not turned on and the RSSI reference value being not used, and wherein the processor enables full duplex communication with another wireless communication device by controlling a time sharing function of the antenna.

2. The smart watch of claim 1, wherein the processor sets a group of other devices having the digital radio function, which perform communication through a sharing function using a code combination, and enables communication only among devices having the digital radio function in the set group.

3. The smart watch of claim 1,
wherein the processor is connected to the A/D converter and the comparator in parallel and automatically outputs the digital voice signal input from the A/D converter to the RF transceiver according to a signal input from the comparator.

4. The smart watch of claim 1, further comprising an input portion for inputting a signal including a push-to-talk (PTT) to the processor.

5. The smart watch of claim 1, wherein a smart phone paired with the smart watch is connected to the processor and displays and changes a system setting value and status information of the smart watch having the digital radio function on a screen.

6. The smart watch of claim 1, wherein the processor outputs a signal to the RF transceiver while dividing the signal into a basic packet and a control INST packet, the basic packet is a transmission and reception digital basic frame including voice data, and the control INST packet is a frame including a control instruction set necessary in addition to transmission of the voice data and additionally and separately transmitted to the basic packet whenever an instruction occurs.

7. The smart watch of claim 6, wherein the basic packet comprises a preamble, a starter code, a transmission ID, a reception ID, a pairing code, a control INST, voice data, and a completion code, and the control INST packet comprises a packet delay, a slot number, a slot ranking, a master, a slave, remote transmission, Reserve 1, and Reserve 2.

8. The smart watch of claim 7, wherein the master and the slave of the control INST packet comprise:
information on a master that distributes a control instruction set,
information on a slave that receives the control instruction set distributed by the master, and
information that the master transfers authority of distributing the control instruction set to a particular slave.

9. The smart watch of claim 7, wherein the remote transmission of the control INST packet comprises information on transmission control and exclusive reception of a master with respect to a particular slave.

10. The smart watch of claim 7, wherein a slot number n and a slot ranking N are indicated in the slot number and the slot ranking of the control INST packet such that when a number of communicators in the communication group exceeds the slot number n, a new communicator is allowed to enter the slot number while replacing a communicator of a last ranking N to perform communication, and wherein a communicator with a slot number exceeding n in the group performs reception from all the communicators.

11. The smart watch of claim 6, wherein a maximum time slot Tn of the basic packet equals a packet delay/a slot number T/n, and
wherein the slot number n is an integer smaller than a value obtained by <a maximum transmission velocity/a general voice sampling velocity of 20 kbps> and is extensible through data compression.

12. The smart watch of claim 1, wherein in a standby status for receiving a signal from another device having the digital radio function through the antenna or in a standby status for receiving an analog voice signal from the other device through the reception portion, the processor remains in a sleep mode for a preset time and then operates in an auto-polling mode for a preset time to repetitively perform conversion into the sleep mode and the auto-polling mode so as to reduce power consumption while standing by for reception.

13. The smart watch of claim 1, wherein the processor transmits the communication group setting information to other devices having the digital radio function within a limited range so as to set the communication group with the other devices having the digital radio function.

14. The smart watch of claim 13,
wherein when the DTMF signal is input through the reception portion, the processor obtains the communication group setting information by decoding the input DTMF signal.

15. The smart watch of claim 14, wherein the DTMF signal has frequency components of a 4×4 matrix.

16. The smart watch of claim 13,
wherein when the communication group setting information is received through the antenna, the processor extracts the RSSI reference value from the received communication group setting information and checks the received communication setting information when a measured RSSI value is greater than or equal to the extracted RSSI reference value.

17. The smart watch of claim 16, wherein the communication group setting information comprises a control INST packet, and the RSSI reference value is included in an area of Reserve 1 or Reserve 2 of the control INST packet.

18. The smart watch of claim 13, wherein the communication group setting information comprises ID, a pairing code, a master, a slave, and a control INST of another device having the digital radio function to be included in the communication group.

19. The smart watch of claim 13, wherein the processor amplifies a signal received through the antenna and transmits the amplified signal through the antenna so as to allow the smart watch having the digital radio function to perform a repeater or relay function.

\* \* \* \* \*